United States Patent

Lean et al.

[15] 3,684,892

[45] Aug. 15, 1972

[54] HIGH GAIN WIDE BAND ACOUSTIC SURFACE WAVE TRANSDUCERS USING PARAMETRIC UPCONVERSION

[72] Inventors: Eric Gung Hwa Lean, Mahopac; Robert Valdimir Pole, Yorktown Heights; Samuel Chin-Chong Tseng, Ossining, all of N.Y.

[73] Assignee: International Business Machines Corporation, Armonk, N.Y.

[22] Filed: Oct. 15, 1970

[21] Appl. No.: 80,860

[52] U.S. Cl. .....................307/88.3, 330/4.6, 330/5.5

[51] Int. Cl................................H03f 3/04, H03f 7/00

[58] Field of Search ................330/4.6, 5.5; 307/88.3

[56] References Cited

UNITED STATES PATENTS

| | | | |
|---|---|---|---|
| 3,614,463 | 10/1971 | Slobodnik | 330/5.5 |
| 3,582,838 | 6/1971 | DeVries | 330/5.5 |

OTHER PUBLICATIONS

Tseng, " IBM Technical Disclosure Bulletin," March 1970, p. 1699–1700.

Lean et al., " Applied Physics Letters," July 1, 1969, p. 10–12.

Lean et al., " Applied Physics Letters," Jan. 1, 1970, p. 32–35.

*Primary Examiner*—Roy Lake
*Assistant Examiner*—Darwin R. Hostetter
*Attorney*—Sughrue, Rothwell, Mion, Zinn & Macpeak

[57] ABSTRACT

Parametric upconverter acoustic surface wave transducer exhibiting high efficiency with wide band operation. The transducer consists of a combination of two constituent transducers, one a narrow bandwidth, high efficiency transducer and the other a wide bandwidth, low efficiency transducer, coupled to produce a resultant acoustic wave of a frequency equal to the sum of the frequencies of acoustic waves supplied by the low and high efficiency transducers. By properly selecting the center frequency of the low efficiency transducer relative to center frequency of the high efficiency transducer as well as the input electric power, the efficiency of the transducer of this invention may be made greater than the efficiency of the low efficiency transducer while retaining its wide bandwidth.

2 Claims, 8 Drawing Figures

FIG. 1 PRIOR ART
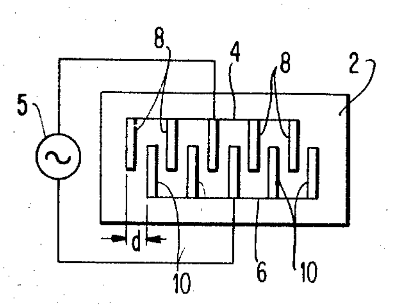
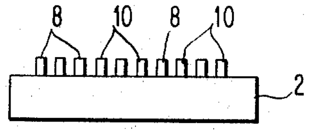
FIG. 2 PRIOR ART
FIG. 4
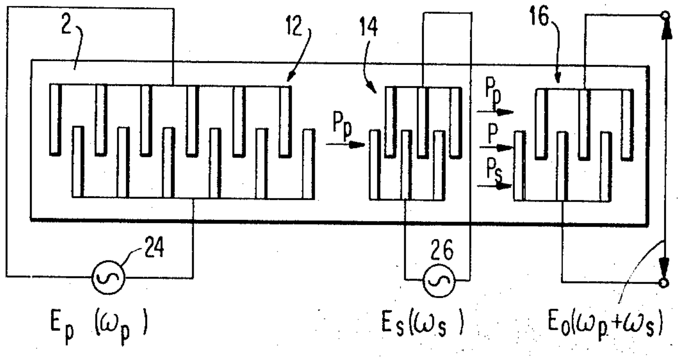
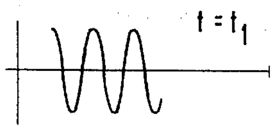
FIG. 3a
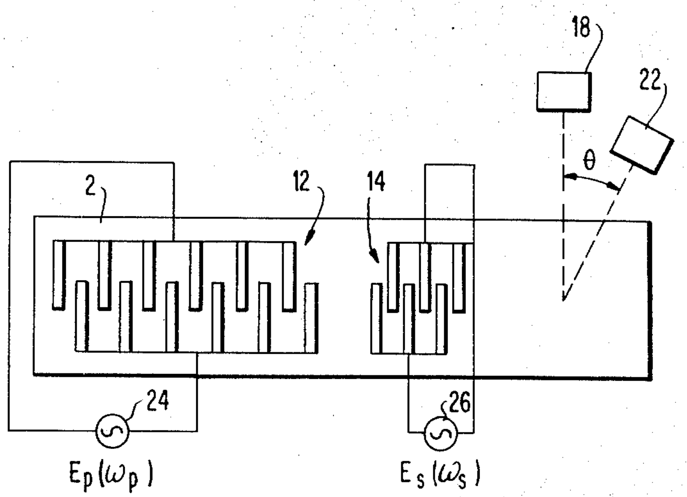
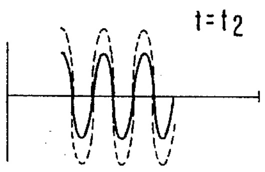
FIG. 3b
FIG. 5
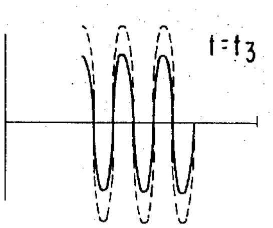
FIG. 3c
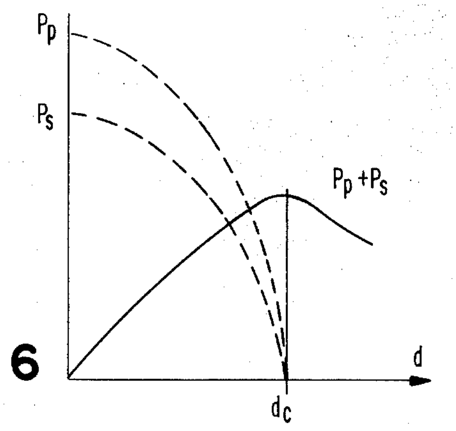
FIG. 6
INVENTORS
ERIC G. LEAN
ROBERT V. POLE
SAMUEL C-C TSENG
BY Sughrue, Rothwell, Mion, Zinn & Macpeak
ATTORNEYS

HIGH GAIN WIDE BAND ACOUSTIC SURFACE WAVE TRANSDUCERS USING PARAMETRIC UPCONVERSION

BACKGROUND OF THE INVENTION

The invention is in the field of acoustic surface wave transducers.

An interdigital acoustic surface wave (ASW) transducer converts input electrical signals into acoustic waves traveling along the surface of a suitable substrate. Such a transducer comprises a substrate capable of supporting high frequency acoustic waves, in the ultrasonic band or higher, upon which are deposited interleaved conductive fingers. By applying opposite electrical potentials to alternate fingers, acoustic stress waves are formed which radiate along the surface of the substrate.

Since the acoustic waves propagate along the surface of the substrate, rather than through the body of the substrate as in bulk acoustic transducers, the waves are easily accessible to known output transducer means along the entire length of propagation.

In addition, the high concentration of acoustic energy near the surface enables one to operate the surface wave device in an elastically nonlinear state.

It is well known that ASW transducers conserve their gain bandwidth product. The gain or efficiency of such a transducer, defined as the acoustic power out divided by the electrical power in, is directly proportional to the number of fingers in the transducer for a constant voltage input, while the bandwidth is inversely proportional thereto. Thus, while a transducer with a large number of fingers has high efficiency, it can be operated only within very narrow deviations of its center frequency. On the other hand, a transducer with a small number of fingers can be operated over a relatively wide band of frequencies but has low efficiency. This conservation of the gain-bandwidth product presents serious limitations on the use of ASW transducers in many applications.

SUMMARY OF THE INVENTION

In order to overcome the deficiencies of the prior interdigital acoustic surface wave transducers, there is provided a transducer which consists of a narrow bandwidth, high efficiency transducer and a wide bandwidth, low efficiency transducer arranged on a common substrate such that there is a parametric interaction between the acoustic outputs of the two transducers resulting in an output wave whose center frequency is the sum of the center frequencies of the two ASW transducers. By properly selecting the center frequency of the low efficiency transducer relative to the center frequency of the high efficiency transducer as well as the input electric power, the efficiency of the transducer disclosed herein may be made greater than that of the low efficiency transducer.

BRIEF DESCRIPTION OF THE DRAWINGS

FIG. 1 is a representation of the top view of a known interdigital ASW transducer.

FIG. 2 is a side view of the interdigital ASW transducer of FIG. 1.

FIGS. *3a* through *3c* are representations of the acoustic surface wave propagated in the transducer of FIG. 1 along with representations of the enhancement effect realized when the applied electrical signal is in phase with the acoustic stress wave.

FIG. 4 shows one embodiment of the invention.

FIG. 5 shows a second embodiment of the invention.

FIG. 6 is a representation of power distance along a substrate.

DETAILED DESCRIPTION OF THE PREFERRED EMBODIMENTS

FIG. 1 illustrates a known transducer comprising a substrate 2 upon which is deposited a first series of conductive fingers 8 and a second series of conductive fingers 10 interleaved with the conductive fingers 8. The fingers 8 are interconnected by conductive means 4. Conductive means 4 is connected to one terminal of an AC source 5 by any suitable means. Similarly, conductive fingers 10 are interconnected by means of conductive means 6, which is connected to the other terminal of AC source 5 by any suitable means. FIG. 2 is a side view of the transducer of FIG. 1.

Operation of the transducer will now be described with reference to FIGS. *3a–3c*. These figures represent a traveling acoustic wave in relation to the distance along substrate 2. The wave travels at a velocity, $v$, determined by the substrate. The center frequency of the transducer is determined by the distance between adjacent fingers and the velocity of the wave. If $d$ equals the distance between adjacent fingers (see FIG. 1), the wavelength, $\lambda$, of the transducer is given by the expression $\lambda = 2d$. Since the center frequency of the transducer $f_a$ relates to the wavelength $\lambda$ by the expression, $f_a = v/\lambda$, the center frequency becomes $f_a = v/2d$.

With reference to FIG. *3a*, at an instant of time, the application of an electrical potential to the fingers of the transducer such that the potential applied to fingers 8 from source 5 is positive with respect to the potential on fingers 10, causes an acoustic surface wave to be formed with positive peaks corresponding to the potential on fingers 10. This wave travels along the substrate from left to right as indicated.

At time, $t = t_2$, the acoustic wave shown in FIG. *3a* has traveled to a position as indicated by the solid curve in FIG. *3b*. If, at $t = t_2$, the potential on the fingers is reversed, the magnitude of the acoustic wave is enhanced as indicated by the dotted wave. As the wave propagates along the surface of the transducer, at time $t = t_3$, the enhanced wave of FIG. *3b* appears as the solid wave in FIG. *3c*. If again the potential on the fingers is reversed, the acoustic wave is enhanced as indicated by the dotted wave. If the switching of the potential on the fingers is synchronized with the center frequency of the transducer each time the potential on the fingers is reversed, the acoustic wave is enhanced. This process continues until the wave reaches the last finger. The wave then continues to travel along substrate 2. This wave can be detected and converted back into electromagnetic energy by known output means positioned along the substrate in line with the ASW propagation.

On the other hand, if the input signal is not synchronized with the center frequency of the transducer, the acoustic wave disintegrates as it propagates between the fingers of the transducer. For example, if at $t = t_2$ the input signal is 180° out of phase with the acoustic wave, the acoustic wave would be destroyed. Where the input signal is out of phase with the acoustic wave by less than 180°, the propagating acoustic wave will decay at a rate proportional to the phase difference between the acoustic wave and the input signal.

Therefore, as the number of fingers increases, the acoustic wave is under the influence of the applied potential for greater periods of time. For this reason, the greater the number of fingers the more susceptible the wave becomes to enhancement or decay. If the input signal is at a frequency equal to the center frequency of the transducer, the larger the number of fingers, the greater the enhancement. However, where the frequency of the input signal is not synchronized with the center frequency of the transducer, the larger the number of fingers, the greater the decay of the acoustic wave as it travels past the fingers. In other words, the larger the number of fingers, the greater the transducer's enhancement capability (high efficiency) and its sensitivity to frequency deviation (narrow bandwidth).

FIG. 4 illustrates one embodiment of the invention. Like numerals in the figures indicate common elements. In the embodiment shown in FIG. 4, the transducer of the invention consists of a substrate 2 which may be of any material suitable for supporting acoustic surface waves. Examples of such material are lithium niobate ($LiNbO_3$) and bismuth germanium oxide ($Bi_{12}GeO_{20}$). Three groups of interleaved fingers are deposited on the substrate 2. These fingers are formed of conductive materials such as copper, aluminum or gold. The larger number of interleaved fingers deposited on substrate 2 form a high efficiency, narrow bandwidth transducer 12 called the pump transducer. An acoustic wave produced by transducer 12 travels along substrate 2 in the manner previously described. This wave produces acoustic power of a value $P_p$. Transducer 12 is supplied with alternating potential from the AC source 24 operating at a center frequency of $\omega_p$. The frequency $\omega_p$ corresponds to the center frequency of the transducer 12. The relatively small number of fingers connected to source 26 form transducer 14, called the signal transducer. The signal transducer, which in operation receives information signals, is a wide band, low efficiency transducer. AC source 26 supplies an information signal at a center frequency $\omega_s$ corresponding to the center frequency of transducer 14. In response to the input signal $E_s$ ($\omega_s$) an acoustic wave of power $P_s$ propagates along the substrate. The third group of fingers form output transducer 16. Preferably, this transducer contains the same number of fingers as the signal transducer 14. Its purpose is to convert the acoustic waves from transducers 12 and 14, combined by parametric action along substrate 2 into an acoustic wave of frequency equal to $\omega_o = \omega_p + \omega_s$, into an electromagnetic output wave.

Transducers 12 and 14 are juxtaposed along the line of ASW propagation. As indicated in FIG. 4, the two acoustic waves $P_p$ and $P_s$ propagate co-linearly. Since transducer 12 is highly efficient and can produce considerable ASW power at a frequency $\omega_p$, there will be a periodic nonlinear change in the elastic constant of the substrate material. This periodic variation of the elastic constant, a parameter of the material, provides a coupling between the acoustic wave $P_p$ and the acoustic wave $P_s$. As a result, there is generated an acoustic wave $P_o$ propagating at a frequency $\omega_o$, where $\omega_o = \omega_p + \omega_s$. There are, of course, other waves produced propagating at frequencies which are other linear combinations of $\omega_p$ and $\omega_s$, such as $\omega_p - \omega_s$. For the purpose of understanding this invention these waves are disregarded, since transducer 16 acts as a filter. By properly spacing the fingers of transducer 16, it will have a response curve centered at frequency $\omega_o$.

As will be described, the up-conversion of frequency allows the pumping power $P_p$ to transfer more energy to $P_o$ than to $P_s$. It can then be shown that by properly selecting $\omega_o/\omega_s$ in relation to the input electric power, the efficiency of the transducer of this invention may be made greater than that of of transducer 14 acting alone.

Assuming lossless propagation in substrate 2, periodic interchange of energy between the acoustic wave $P_o$ and acoustic wave $P_s$ results in a power transfer to wave $P_o$ such that the relative powers in waves $P_s$ and $P_o$ satisfy the Manley-Rowe relationship:

$$P_o/P_s = \omega_o/\omega_s$$

The overall efficiency of the composite transducer is given by the equation:

$\eta = P_o/P'_p + P'_s$ where $P'_p$ equals electrical input power from source $E_p$ and $P'_s$ equals electrical input power from source $E_s$.

The efficiency of the transducer 14 is given by the equation:

$\eta_s = P_s/P'_s$ with the efficiency of the transducer 12 by $\eta_p = P_p/P'_p$.

Thus, the ratio of the efficiency of the composite transducer of this invention to the transducer 14 is given by the expression:

$$\frac{\eta}{\eta_s} = \frac{\dfrac{P_o}{P_p' + P_s'}}{\dfrac{P_s}{P_s'}} = \frac{P_o}{P_s} \cdot \frac{P_s'}{P_p' + P_s'}$$

However, since the Manley-Rowe relationship is applicable, $$\frac{\eta}{\eta_s} = \frac{P_s'}{P_p' + P_s'} \cdot \frac{\omega_o}{\omega_s} = \frac{1}{\dfrac{P_p'}{P_s'} + 1} \cdot \frac{\omega_o}{\omega_s} = \frac{\omega_o}{\omega_s} \cdot \frac{1}{1 + \dfrac{P_p}{P_s} \cdot \dfrac{\eta_s}{\eta_p}}$$

Since, for non-linear interaction to take place, the pumping power $P_p$ is usually larger than the signal power $P_s$, $P_p/P_s$ may be larger than one. However, the efficiency of the pumping transducer $\eta_p$ is much larger than that of the signal transducer $\eta_s$. Consequently, $\eta_s/\eta_p$ is much smaller than one. As a result, $P_p/P_s \cdot \eta_s/\eta_p$ can be maintained at a value less than one.

Considering the worst case, which occurs when the electrical input power to transducer 12 is chosen, equal to the electrical input power to the transducer 14, the above expression becomes:

$$\eta/\eta_s = \tfrac{1}{2}\,\omega_o/\omega_s$$

The ratio $\omega/\omega_s$ increases with decreasing values of $\omega s$. However, there is a limit to the minimum value of $\omega s$. If $\omega s$ is too small, the allowable variation in frequency $\Delta\omega s$ is limited because $\Delta\omega s = \delta\omega s$ where $\delta$ is the fractional bandwidth which is determined only by the number of fingers in transducer 14. Thus, a balance must be reached wherein there is obtained a suitable up-conversion in frequency along with an increase in efficiency. If $\omega_s$ is made equal to $\omega_p/4$ for example, $$\frac{\omega_o}{\omega_s} = \frac{\omega_s + \omega_p}{\omega_s} = \frac{\frac{5\omega_p}{4}}{\frac{\omega_p}{4}} = 5$$

Therefore, in the lossless case, selection of $\omega s = \omega_p/4$ results in an output signal whose frequency $\omega_o$ is 5 times greater than $\omega_s$ and an efficiency $\eta$ 2.5 times that of the efficiency $\eta_s$.

Proper selection of the position of output transducer 16 is important for at some point along substrate 2 the interchange of energy between waves $P_s$ and $P_o$ is complete. It is at this point that the output transducer should be placed. FIG. 6 is a representation of power versus distance along the substrate. At point $d_c$ the power $P_s$ has been completely transferred to the wave $P_o$.

For any particular transducer, the value of $d_c$ can be obtained experimentally by positioning output transducer 16 at various locations on substrate 2 and measuring the output power.

FIG. 5 shows another embodiment of the invention where the output transducer takes the form of a coherent light source 18 passing a beam of light onto substrate 2. Acoustic stress waves traveling along the surface of substrate 2 cause the beam to be deflected at an angle $\theta$. As is known, the value of $\theta$ is proportional to the frequency of the acoustic wave. The reflected wave is detected by photodetector 22. Detector 22 may be any well known photodetector which is capable of converting received light into electrical output signals.

Where the substrate 2 is transparent to the impinging light, detector 22 may be positioned on the opposite sides of the substrate to detect the transmitted light. The angle at which the transmitted light emerges from the substrate is again proportional to the frequency of the acoustic wave. The composite transducer can therefore be used as an efficient light deflector, because the pumping transducer supplies the power wave, while the signal transducer supplies a variable frequency wave which varies the angle of deflection.

In a certain class of applications, such as a system using the auto-correlation technique for signal detection, there must be generated at a time reversal replica of a signal to convolve with the original signal itself. The present invention can perform this function easily. For convenience in explanation, let us take the case where the signal is a linearly frequency modulated wave whose frequency variation versus time is expressed by $$f = f_1 + [(f_2 - f_1)/(t_2 - t_1)](t - t_1)$$

In order to generate two signals, one of which is the time reversal replica of the other, this linear FM wave can be applied to the signal transducer of composite transducers in two delay lines ($T_1$ and $T_2$). The pump frequency of delay line $T_1$ can be set at $f_p$, while that of the other line $T_2$ can be set at the frequency $f_p + f_1 + f_2$. Then, the up-converted signal from line $T_1$ and the down-converted signal from line $T_2$ will be time reversal replicas of each other, since the output signal from $T_1$ and $T_2$ will be, respectively:

$$f_{T1} = f_p + f_1 + \frac{(f_2 - f_1)}{(t_2 - t_1)}(t - t_1)$$

$$f_{T2} = f_p + f_2 - \frac{(f_2 - f_1)}{(t_2 - t_1)}(t - t_1)$$

While the invention has been particularly shown and described with reference to the preferred embodiments thereof, it will be understood by those skilled in the art that various changes in form and detail may be made therein without departing from the spirit and scope of the invention.

What is claimed is:

1. An acoustic surface wave parametric upconverter transducer comprising:

a. an elastically nonlinear substrate for supporting acoustic surface waves;

b. a plurality of N interleaved conductive fingers formed on said substrate, alternate ones of said fingers being interconnected for producing a first acoustic surface wave having a first center frequency;

c. a plurality of $n$ interleaved conductive fingers formed on said substrate in a position along the path of acoustic surface wave propagation initiated by said plurality of N interleaved conductive fingers, where $n < N$, for producing a second acoustic surface wave having a second center frequency, whereby there is produced on said substrate a third acoustic surface wave at a frequency equal to the sum of the frequencies of said first and second acoustic surface waves; and d. output transducer means responsive to said third acoustic surface wave at a point where the energy of said second acoustic surface wave has been substantially completely transferred to said third acoustic surface wave for converting said third acoustic surface wave into an electromagnetic wave, said output transducer means comprising a coherent light source for directing a beam of light on to said common substrate and means responsive to said beam of light after it has impinged said substrate for receiving said light and converting it into an output electrical signal.

2. The transducer of claim 1 wherein said first center frequency is at least twice said second center frequency.

* * * * *

UNITED STATES PATENT OFFICE

CERTIFICATE OF CORRECTION

Patent No. 3,684,892 Dated August 15, 1972

Inventor(s) Eric Gung Hwa Lean et al

It is certified that error appears in the above-identified patent and that said Letters Patent are hereby corrected as shown below:

In The Specification:

Throughout the specification the symbol "$_s$" is illegable appearing in the following lines:

Col. 3 Line 48 after "frequency" delete "$\omega_8$" insert-- $\omega_s$--

Col. 3 Line 50 after "signal" delete "$E_8$ ($\omega_8$)" insert--$E_s$ ($\omega_s$)--

Col. 3 Line 51 after "power" delete "$P_8$" insert --$P_s$--

Col. 3 Line 57 after "+" delete "$\omega_8$ " insert--$\omega_s$--

Col. 3 Line 62 after "and" delete "$P_8$" insert--$P_s$--

Col. 4 Line 1 after "wave" delete "$P_8$" insert--$P_s$--

Col. 4 Line 3 after "+" delete "$\omega_8$" insert-- $\omega_s$--

Col. 4 Line 5 after "and" delete "$\omega_8$" insert-- $\omega_s$--

Col 4 Line 5 after "-" delete "$\omega_8$" insert--$\omega_s$--

Col. 4 Line 12 after "to" delete "$P_8$" insert--$P_s$--

Col. 4 Line 13 after "$\omega_o$/" delete " $\omega_8$" insert-- $\omega_s$--

Col. 4 Line 21 after "wave" delete "$P_8$" insert--$P_s$--

FORM PO-1050 (10-69)

USCOMM-DC 60376-P69

☆ U.S. GOVERNMENT PRINTING OFFICE : 1969 O—366-334

UNITED STATES PATENT OFFICE
CERTIFICATE OF CORRECTION

Patent No. 3,684,892 Dated August 15, 1972

Inventor(s) Eric Gung Hwa Lean et al

It is certified that error appears in the above-identified patent and that said Letters Patent are hereby corrected as shown below:

Col. 4 Line 25 after "$P_o$/" delete "$P_8$" insert--$P_s$--

Col. 4 Line 25 after "=$\omega_o$/" delete "$\omega_8$" insert--$\omega_s$--

Col. 4 Line 28 after "+" delete "$P'_8$" insert--$P'_s$--

Col. 4 Line 29 after "and" delete "$P'_8$" insert--$P'_s$--

Col. 4 Line 35 before "with" delete "$\eta_8 = P_8/P'_8$"
insert--$\eta_s = P_s/P'_s$--

Col. 4 Line 59 after "power" delete "$P_8$" insert--$P_s$--

Col. 4 Line 59 after "$P_p$/" delete "$P_8$" insert--$P_s$--

Col. 4 Line 61 after "transducer" delete "$\eta_8$" insert--$\eta_s$--

Col. 4 Line 62 before "/$\eta_p$ is" delete "$\eta_8$" insert--$\eta_s$--

Col. 4 Line 62 after "$P_p$/" delete "$P_8$" insert--$P_s$--

Col. 4 Line 62 after "." delete "$\eta_8$" insert--$\eta_s$--

Col. 5 Line 1 delete "$\eta/\eta_8 = 1/2\ \omega_o/\omega_8$"
insert--$\eta/\eta_s = 1/2\ \omega_o/\omega_s$--

Col. 5 Line 11 before "is" delete "$\omega_8$" insert--$\omega_s$--

UNITED STATES PATENT OFFICE
CERTIFICATE OF CORRECTION

Patent No. 3,684,892 Dated August 15, 1972

Inventor(s) Eric Gung Hwa Lean et al - 3 -

It is certified that error appears in the above-identified patent and that said Letters Patent are hereby corrected as shown below:

In The Specification:

Col. 5 Line 2 after "ratio" delete "$\omega / \omega_8$" insert-- $\eta / \eta_s$ Col. 5 Line 2 after "of" delete "$\omega$ s" insert-- $\omega_s$ --

Col. 5 Line 3 after "of" delete "$\omega$s" insert-- $\omega_s$ --

Col. 5 Line 4 before "is" delete "$\omega$s" insert-- $\omega_s$ --

Col. 5 Line 4 after "frequency" delete "$\Delta \omega$" insert-- $\Delta\omega_s$ --

Col. 5 Line 5 before "is limited" delete "s"

Col. 5 Line 5 after "because" delete "$\Delta \omega$s= $\delta \omega$s" insert-- $\Delta \omega_s = \delta \omega_s$ --

Col. 5 Line 56 after "generated" delete "at"

Col. 6 Line 11 after "respectively" the formula is illegable, should read--

$$f_{T1} = f_p + f_1 + \frac{(f_2 - f_1)}{(t_2 - t_1)} (t - t_1)$$

$$f_{T2} = f_p + f_2 - \frac{(f_2 - f_1)}{(t_2 - t_1)} (t - t_1) \text{ --}$$

FORM PO-1050 (10-69)

USCOMM-DC 60376-P69
☆ U.S. GOVERNMENT PRINTING OFFICE : 1969 O—366-334

UNITED STATES PATENT OFFICE
CERTIFICATE OF CORRECTION

Patent No. 3,684,892 Dated August 15, 1972

Inventor(s) Eric Gung Hwa Lean et al

- 4 -

It is certified that error appears in the above-identified patent and that said Letters Patent are hereby corrected as shown below:

Col. 5 Line 20 after "than" delete "$\omega_8$" insert-- $\omega_s$ --

Col. 5 Line 21 after "effeciency" delete "$\eta_8$" insert-- $\eta_s$ --

Col. 5 Line 24 after "waves" delete "$P_8$" insert-- $P_s$ --

Col. 5 Line 28 after "power" delete "$P_8$" insert-- $P_s$ --

Signed and sealed this 1st day of May 1973.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334